United States Patent [19]
Sugimoto et al.

[11] Patent Number: 5,208,680
[45] Date of Patent: May 4, 1993

[54] LAYOUT POSITION DESIGNATING SHEET AND METHOD OF MOUNTING ORIGINAL USING THE SAME

[75] Inventors: Yoshio Sugimoto, Rolling Meadows, Ill.; Masayuki Sasahara, Kyoto, Japan

[73] Assignee: Dainippon Screen Mfg. Co., Ltd., Japan

[21] Appl. No.: 420,155

[22] Filed: Oct. 11, 1989

[30] Foreign Application Priority Data

Oct. 12, 1988 [JP] Japan ................. 63-254900

[51] Int. Cl.⁵ .............................................. H04N 1/00
[52] U.S. Cl. ................................ 358/400; 358/489; 358/493
[58] Field of Search ............... 358/400, 401, 450, 452, 358/, 488, 489, 493, 490; 382/45

[56] References Cited

U.S. PATENT DOCUMENTS

| | | | |
|---|---|---|---|
| 4,622,591 | 11/1986 | Katsuyama et al. | 358/490 |
| 4,673,989 | 6/1987 | Yamada et al. | 358/451 |
| 4,679,155 | 7/1987 | Mitsuka | 358/450 |
| 4,788,578 | 11/1988 | Tamura et al. | 358/451 |
| 4,794,462 | 12/1988 | Kitamura et al. | 358/489 |

FOREIGN PATENT DOCUMENTS 0169967 2/1986 European Pat. Off. .
0206307 12/1986 European Pat. Off. .

*Primary Examiner*—Edward L. Coles, Sr.
*Assistant Examiner*—Thomas D. Lee
*Attorney, Agent, or Firm*—Ostrolenk, Faber, Gerb & Soffen

[57] ABSTRACT

An original mounting sheet attached to a scanner drum for positioning originals for reading a plurality of originals in an image reproducing apparatus such as a color scanner comprises a first reference line along a subscanning direction of a scanner, two second reference lines along the main scanning direction and a third reference line intersecting the first reference line for specifying at least two intersecting sides of the original. The original is positioned on the original mounting sheet with at least one intersecting corner specified.

16 Claims, 6 Drawing Sheets

LAYOUT POSITION DESIGNATING SHEET AND METHOD OF MOUNTING ORIGINAL USING THE SAME

BACKGROUND OF THE INVENTION

1. Field of the Invention

The present invention relates to a layout position designating sheet for mounting originals at desired positions when originals to be reproduced are attached to an image reproduction apparatus such as a color scanner, in image reproduction such as photo mechanical process, and a method of mounting originals using the sheet. More specifically, the present invention relates to a highly cost-effective layout position designating sheet and method of mounting originals using the same.

2. Description of the Related Art

When originals are reproduced by color separation reproduction of color originals using a drum type color scanner, a plurality of originals are generally arranged in a line to be attached to an original drum. The sizes of the color originals are, for example, 6×6 cm, 10×13 cm (4×5") and so on. Meanwhile, the original drum of the color scanner has an area large enough to permit attachment of a plurality of originals in one line. Therefore, the efficiency can be improved when the plurality of originals are attached on the original drum for color separation.

It is desired that the originals be mounted such that trimming lines based on the desired layout of respective originals are aligned with the direction of the scanning line. To that end each of the originals must be attached with the angle of inclination properly determined, so that color separation can be carried out only in the necessary range. Namely, since the trimming frame is generally rectangular, when the original is mounted with the angle of inclination determined such that trimming frame lines are aligned with the main and subscanning directions of the color scanner, efficiency in operation can be very much improved.

The reason for this will be described in the following with reference to FIG. 6. FIG. 6 shows originals of the same size arranged on a surface of an original drum 30 of a color scanner, one of which is arranged with two pairs of trimming lines extending parallel to the main scanning direction and the subscanning direction, respectively, and the other one is arranged inclined.

Referring to FIG. 6, as to the original arranged with the two pairs of trimming lines extending parallel to the main scanning direction and the subscanning direction as shown in the left side of the figure, the input range on the scanner is a in the main scanning direction and b in the subscanning direction. Meanwhile, referring to the right side of FIG. 6, when the original is arranged with the two pairs of trimming lines of the original inclined to the main scanning direction and the subscanning direction, the range of input is a' in the main scanning direction and b' in the subscanning direction. Consequently, as shown by the hatching in the right side of FIG. 6, unnecessary regions are scanned image signals of which region need not be inputted. Therefore, when the original is arranged with the trimming frame lines aligned in the main scanning direction and the subscanning direction, the efficiency in operation can be improved, as described above.

Particularly, when a color scanner is employed for input for electrical page make up, it takes much time to rotate the images electrically. Accordingly, it is desired that the originals be inclined in advance for scanning. For example, U.S. Pat. No. 4,365,273 to Yamada et al. discloses a method of scanning an original utilizing a page-make-up color scanner.

A method of mounting a plurality of originals collectively by using a layout sheet 1 as shown in FIG. 7 has been proposed as a method of determining the position and angle of mounting originals. According to this method, a sheet is prepared on which are drawn outer frame lines $2a$ to $2f$ indicative of the mounting positions of respective originals (for convenience, shown in dotted lines), trimming lines $3a$ to $3f$ and $4a$ to $4f$ in the main scanning direction indicative of the trimming area of the respective originals, trimming lines $5a$ to $5f$ and $6a$ to $6f$ in the subscanning direction, and reference lines 7 and 8 which are the reference in mounting the sheet 1 to the original drum 30 of the color scanner. The reference lines 7 and 8 are drawn in parallel to the trimming lines 3 and 4 in the subscanning direction.

Such an original mounting sheet 1 can be made by manual drafting. However, recently, a drawing apparatus incorporating a projection type digitizer and an X-Y plotter such as shown in FIG. 8 is used for forming desired patterns effectively and highly precisely.

Such a drawing apparatus is disclosed, for example, in Japanese Patent Laying-Open No. 61-295758.

The projection type digitizer 10 has a structure similar to that of a photograph enlarger, comprising an original table 11 on which originals to be reproduced are placed, a lamp house 12 containing a light source provided thereabove, and a lens 13 arranged below the original table 11. The original placed on the original table 11 is irradiated by the light source, and the images on the original are projected to a projection table 14 below, through the lens 13. An X-Y digitizer 15 is provided on the upper surface of the projection table 14, on which surface the images of the original are projected. By adjusting the height of the original table 15 and the lens 13, the images are formed in a dimension designated for the reproduction layout. Distances between each of the original table 11, the lens 13 and the digitizer 15 and the reproduction magnification calculated based on the focal length of the lens 13 are displayed on a magnification displaying portion 16. The original is rotated on the horizontal surface such that the desired trimming frame lines of the projected image are aligned with the X and Y axes of the digitizer 15, whereby the angle of inclination to the trimming frame line of the original is set.

Thereafter, the cursor 17 is successively moved to the respective corners of the projected image and the positions of the trimming frame lines, with the data of the respective positions inputted by using X-Y coordinate values. At the same time, the data of the desired positions in the original are inputted by the cursor 17. The data of the desired positions of the original means characteristic points of the images representative of the trimming position or the angle of the original, such as the positions of the eyes or the position of a brim of a hat in the original.

The inputted data of respective positions are calculated in an attached computer 18, and the shapes of the outer frame lines and the trimming frame lines of the original are displayed on a CRT display 19 in accordance with the result of the calculation.

This operation is repeated for the plurality of desired originals. When all the data of the originals to be mounted are prepared, the X-Y plotter 20 is operated in accordance with the data. Consequently, an original mounting sheet 1 is prepared on which the desired outer frame lines including first reference lines 2a to 2f, the trimming frame lines 3a to 3f and 4a to 4f and second reference lines 5a to 5f and 6a and 6f of the originals and the reference lines 7 and 8 are drawn as shown in FIG. 7.

The above described data may be used as the data for controlling the color scanner for reproducing respective originals. More specifically, the region between the trimming frame lines 3 and 4 in the main scanning direction and between the trimming frame lines 5 and 6 in the subscanning direction is regarded as the region to be reproduced for each of the originals. The image signals of this region are outputted, whereby the images to be reproduced which are trimmed as desired are recorded.

There are methods of mounting respective originals at designated positions by using the original mounting sheet 1. In accordance with a first method, the original mounting sheet 1 is cut along the drawn respective outer frame lines 2. The respective originals are aligned with the corresponding cut windows and fixed thereto by means of sticky tapes. In this manner, a plurality of originals are mounted on the original mounting sheet 1 with the respective trimming frame lines 3, 4, 5 and 6 aligned in the prescribed direction. Thereafter, the original mounting sheet 1 is wound around the original drum of the color scanner. Marks are provided in advance in the subscanning direction on the original drum. The original mounting sheet 1 is wound therearound such that the reference lines 7 and 8 drawn on the original mounting sheet 1 is aligned with the marks. Consequently, the respective originals are mounted on the original drum such that the trimming frame lines 3, 4, 5 and 6 are aligned in the main scanning direction and the subscanning direction.

In accordance with a second method, the respective outer frame lines 2, the trimming frame lines 3, 4, 5 and 6, and the reference lines 7 and 8 are drawn on a transparent sheet. The respective originals are aligned and fixed by sticky tapes on the transparent sheet. Thereafter, the sheet is wound around the original drum in the same manner as in the first method.

The above described first and second methods of the prior art comprise the following drawbacks. The drawback of the first method of cutting windows is that it is difficult to cut windows having the precise dimension and the precise angle of inclination on the original mounting sheet 1 for the respective originals, as it requires elaborate manual operation of a skilled person. This increases the cost.

In addition, since the respective originals to be mounted are different in thickness, the sheet 1 is distorted. Therefore, when the sheet 1 is wound around the original drum, the sheet may not be entirely in close contact with the drum surface and portions of the sheet 1 may lift away from the surface. Since the original drum of the color scanner is rotated at a high speed of about several hundred rpm during operation, the sheets may peel and scatter when the wound sheet is distorted Worse than peeling, the quality of the reproduced images may be degraded as the positions of the originals are moved.

In addition, when dust and the like is present between the surface of the original drum and the originals, white spots are generated on the reproduced images, degrading the quality of the images. In order to prevent such spots, dusts must be cleared when the sheet is mounted.

However, it is very difficult to completely eliminate the dust on the entire surface of the original mounting sheet 1 which has a large area. It may take longer than mounting the originals directly on the original drum one by one.

A non-stretchable sheet material, for example a Mylar sheet is used as the original mounting sheet 1 in order to make sure the positions of mounting the original and the precision of the angle of inclination. Such sheet materials of high quality are expensive, increasing the cost of image reproduction. Especially in the first method of cutting windows in the original mounting sheet 1, when the spaces between windows are too small, the sheet becomes weak and it may be greatly distorted or damaged. In order to prevent such problems, the density of arrangement of the originals should be low. Namely, the respective originals must be arranged spaced apart from each other. The efficiency in arranging the originals on the sheet and the efficiency of operating the scanner are both decreased.

The problems of the second method employing a transparent sheet are as follows. Unlike the first method, it is not necessary to provide windows. However, the problem of dust between the transparent sheet and the original drum surface is the same. In addition, as in the first method, the outer frame lines 2 of the respective originals are drawn on the original mounting sheet 1 such that the lines in the entirety thereof do not overlap one another. Therefore, relatively large area of the sheet 1 is still required, increasing the cost of the materials.

SUMMARY OF THE INVENTION

Therefore, one object of the present invention is to eliminate the above described problems.

The above described object of the present invention can be attained by the layout position designating sheet having the following elements. The original has at least two intersecting sides and the image reproducing apparatus defines the desired portion for reproduction by a pair of first reference lines in the first direction and a pair of second reference lines in a second direction intersecting the first direction. The sheet includes one of the first reference lines, the pair of the second reference lines and a third reference line intersecting the first reference line defining at least two sides intersecting with each other of the original. Therefore, only one first reference line in the first direction is drawn on the sheet for designating the desired position. Another one of the first reference lines for designating the desired portion is not drawn on the sheet. Therefore, the area of the position designating sheet for positioning the original can be reduced. Accordingly, the position designating sheet which is cost-effective can be provided.

In accordance with another aspect of the present invention, a method of positioning originals by using a layout position designating sheet employed in an image reproducing apparatus for reproducing originals includes the following steps. The sheet has first reference line in a first direction and a pair of second reference lines intersecting the first reference line for designating a desired area of an original and a third reference line intersecting the first reference line for designating at least two intersecting sides of the original. The position designating sheet divided into a first portion in which an intersecting point of the first reference line and the third reference line exists at a second portion in which the intersecting point do not exist. The method comprises the steps of removing the second portion, eliminating the area defined by the third reference line existing in the first portion, and positioning the original in the first portion along the third reference line of the position designating sheet.

The position designating method of the present invention comprises the above described steps. Since an original is positioned by using only a part of an original with the position designating sheet, the position designating sheet does not entirely support the original. Therefore, there is no possibility that the position designating sheet as a whole, not rising up, will be moved, so that the position of the original is not changed. Consequently, a method of positioning using position designating sheet in an image reproducing apparatus capable of preventing degradation of qualities of images can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The layout position designating sheet in accordance with the present invention will be described with reference to FIG. 1.

On a sheet (21) are drawn dividing lines (22a) to (22e) for dividing the sheet into a plurality of parallel strip areas (23a) to (23e) and reference lines 24 are drawn parallel to the dividing lines (22) in each strip area (23). When one strip area (23a) or (23b) is applied for mounting a plurality of originals, the respective reference lines (24a) to (24c) or (24d) to (24f) are drawn aligned on the same line.

Figure 8:
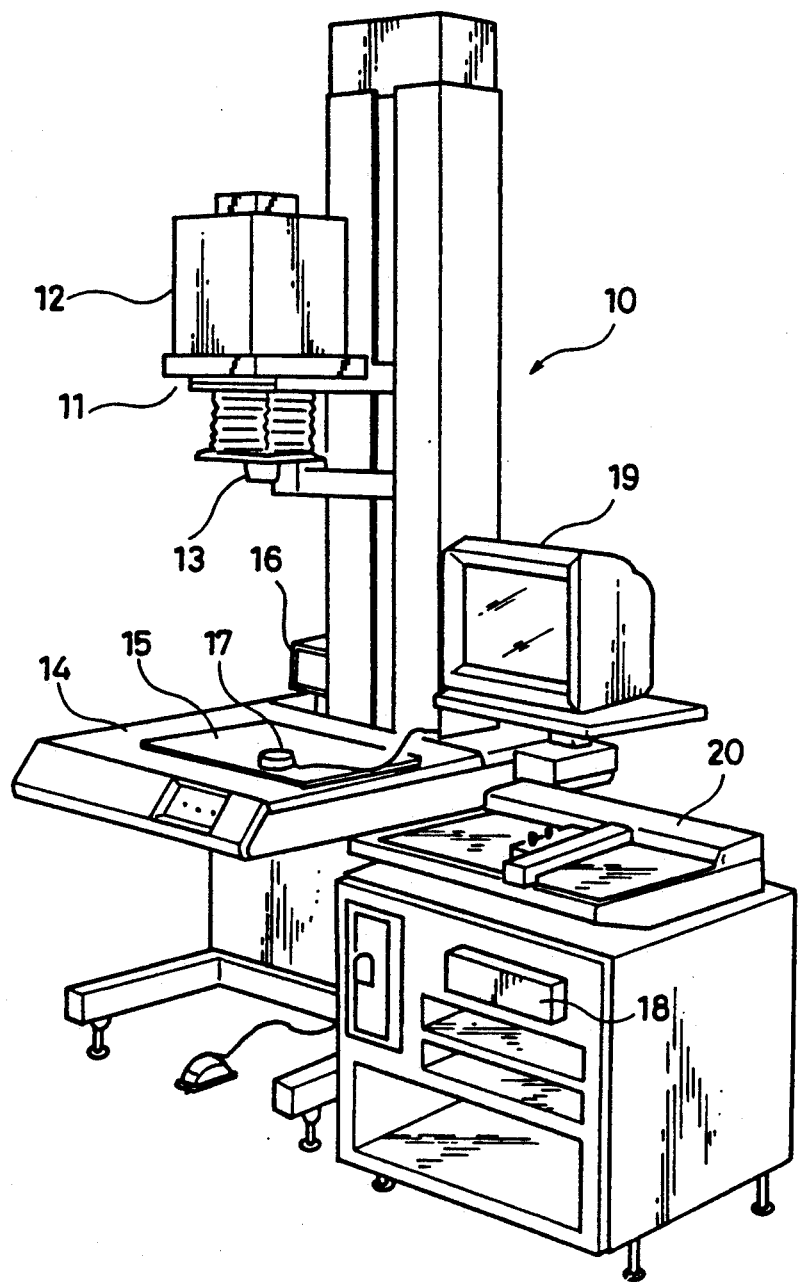
FIG. 8 is a perspective view showing a projection type digitizer and an X-Y plotter for forming the original mounting sheet.

In accordance with a desired layout, two trimming frame lines (25) and (26) which orthogonally intersect the reference line (24) when a side of a trimming frame of the original to be reproduced is aligned with that reference line (24) and an outer frame line (27) indicative of the shape of the original included in the strip area (23) are drawn. In the embodiment shown in FIG. 1, the sheet (21) is divided into 5 strip areas (23a) to (23e). Three sets of the reference line (24), the trimming lines (25) and (26) and the outer frame line (27) are drawn in each of the strip areas. The number of sets may be arbitrarily selected in accordance with the size of the original and of the sheet. These lines can be drawn by using the projection type digitizer and the X-Y plotter shown in FIG. 8. Although the outer frame line (27) is shown by the dotted line for convenience, it may be a solid line in practice. For convenience of description, characters (a) to (f) are attached to the reference lines (24), the trimming lines (25) and (26) and the outer frame line (27) of the respective sets. The same characters are used for the corresponding originals.

In a broad sense, there are two methods for setting the positions and the angle of inclination of the originals to be reproduced by using this sheet (21). One is a method in which the sheet (21) is cut into the strip areas (23), another is a method in which the sheet (21) is used as itself, without cutting.

The first method in which the sheet is cut into the strip area (23) will be described first.

Figure 2:
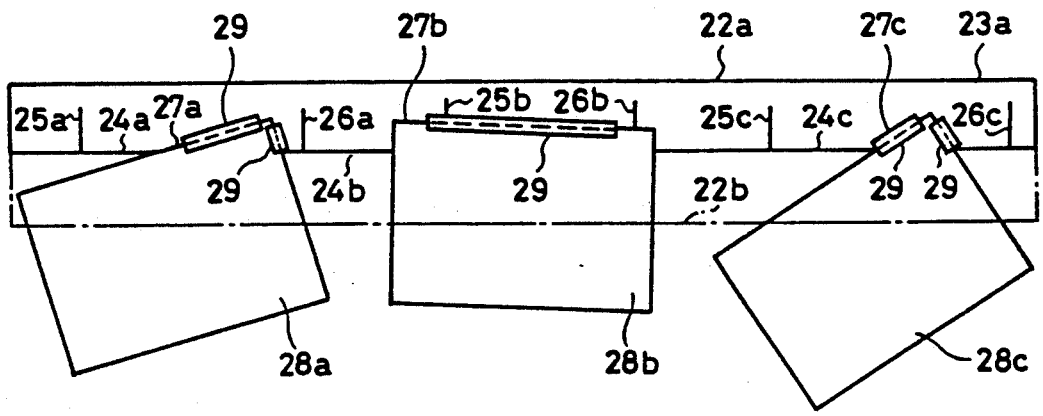
FIGS. 2 and 3 show the original mounting sheet shown in FIG. 1 used at strips.

FIG. 2 is a schematic diagram showing 3 originals (28a) to (28c) mounted by using one strip area (23a) cut from the sheet (21). After the strip area (23a) is cut away from the sheet (21), the lower half portion denoted by the dotted line (22b) below the reference line (24) is removed. Thereafter, portions along the respective outer frame lines (27a) to (27c) drawn on the remaining portion are cut. In the following, the resulting cut sheet is referred to as a strip (23a).

A first original (28a) is fixed by a sticky tape (29) with the edge sides aligned with the edges provided by cutting the outer frame line (27a). Positioned in this manner, one trimming frame line of the original (28a) is aligned with the reference line (24a) of the strip (23a), and the trimming frame lines (25a) and (26a) drawn on the strip (23a) correspond to the positions indicative of the trimming area of the original (28a).

The second and third originals (28b) and (28c) are fixed in the same manner by using sticky tapes (29) with the outer frame lines (27b) and (27c) aligned with the edges.

When a prescribed number of originals are mounted on one strip (23a), the strip is mounted on the original drum (30) of a color scanner. On this occasion, the reference line (24) of the strip (23a), that is, the edge provided by cutting the lower half portion is aligned with a reference line (31) provided in the axial direction, of the original drum (30), so that the strip is properly positioned. Thereafter, the strip is fixed by using sticky tape or the like. Those sides of the respective originals (28) which are not fixed on the strip (23a) are wound along the cylindrical surface of the original drum (30) and fixed thereon by the sticky tape or the like. In this manner the originals are mounted one by one without problem of dust and the completely removed.

Thus the respective originals (28) are mounted on the original drum (30) with angles of inclination matching the desired layout. A pair of trimming frame lines (25) and (26) indicative of the trimming area in the subscanning direction and a trimming frame line (24) (cut side) in the main scanning direction are designated for each of the originals on the strip (23a). This original drum (30) is attached to a color scanner. When photoelectric scanning is carried by this color scanner, the image signals are turned on/off in accordance with the positions of the respective trimming frame lines (24), (25) and (26) shown on the strip (23a), whereby image signals for recording the reproduced images trimmed as desired are outputted.

In this case, only one of the trimming frame lines in the main scanning direction is shown. The line corresponding to the trimming frame line (4) in the conventional method shown in FIG. 7 does not exist. However, this does not cause any problem in practice when the respective originals (28) are arranged in the downstream side of the main scanning direction in relation to the strip (23a) as the original drum (30) is rotated in the direction of the arrow (R).

More specifically, when the original data are inputted by the projection type digitizer (6) at first, the position data of the trimming frame line in the downstream side are inputted. Therefore, the trimming frame line in the downstream side are inputted as the control data of the color scanner in a memory apparatus, though the trimming line is not drawn on the sheet (21). By inputting these data into the color scanner, the length of trimming in the main scanning direction are converted into the rotation angle of the original drum (30) for the respective originals (28). The color scanner may be controlled such that the image signals are outputted from a position at which the position of the reference line (24) is scanned to a position where the original drum (30) is rotated by the prescribed angle.

The angle of rotation may be determined by counting a prescribed number of clock pulses outputted from a rotary encoder driven in synchronization with the original drum (30). Alternately, the image signals may be outputted for a prescribed time period from the scanning of the reference line (24) by using an appropriate timer.

Figure 3:
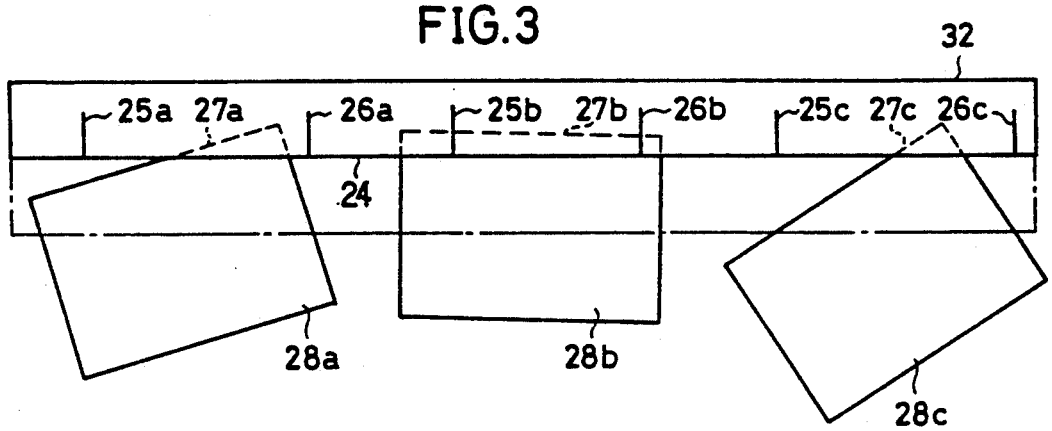
Figure 4:
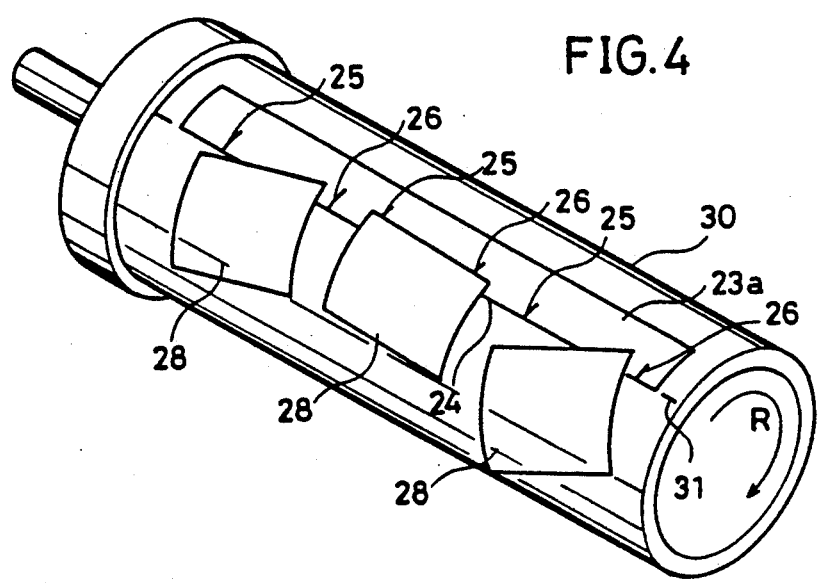
FIG. 4 is a perspective view showing capacity of mounting originals on an original drum of a color scanner by using the strip.

FIG. 3 shows another embodiment of mounting originals, using the strip described above.

The strip (32) in this embodiment is a transparent sheet, the rear surface of which is coated with an adhesive. The reference lines (24), the trimming frame lines (25) and (26) and the outer frame lines (27) are drawn on the front surface which is non-adherable.

As in the embodiment shown in FIG. 2, the lower half portion below the reference line (24) of the strip (32) is removed. Respective originals (28) are applied on the adhesive surface, i.e., the rear surface aligned with the shown outer frame lines (27).

As in the embodiment of FIG. 2, the strip is mounted on the original drum (30) of the color scanner with the reference line (24) aligned with the reference line (31) of the original drum (30) and the color scanner is controlled in the same manner.

In the following, another method of using the shown in FIGS. 5A and 5B, (21) will be described in which the sheet is not cut in strip areas.

Figure 5A:
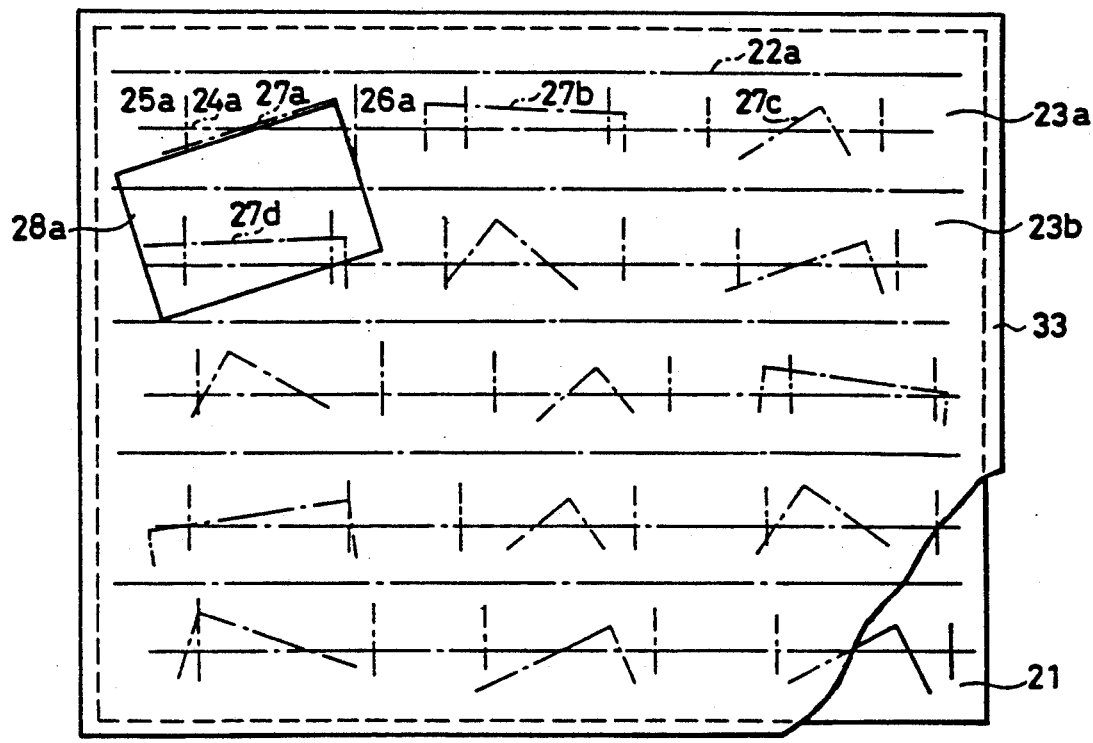
FIGS. 5A and 5B are schematic diagrams showing a process for mounting originals on a transparent sheet.
Figure 5B:
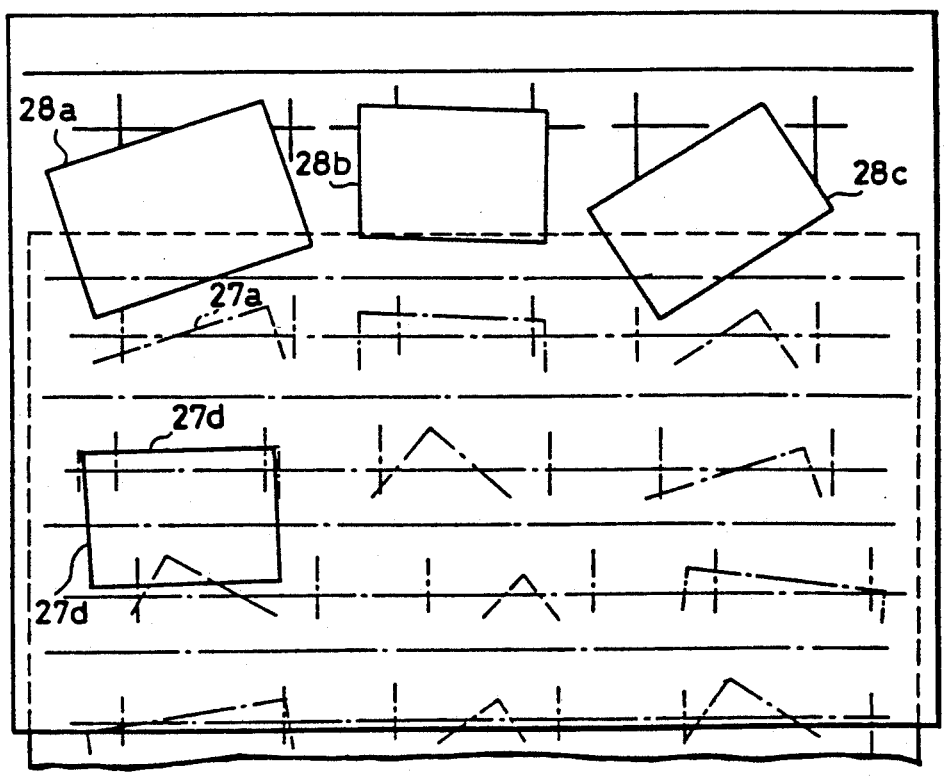
Figure 6:
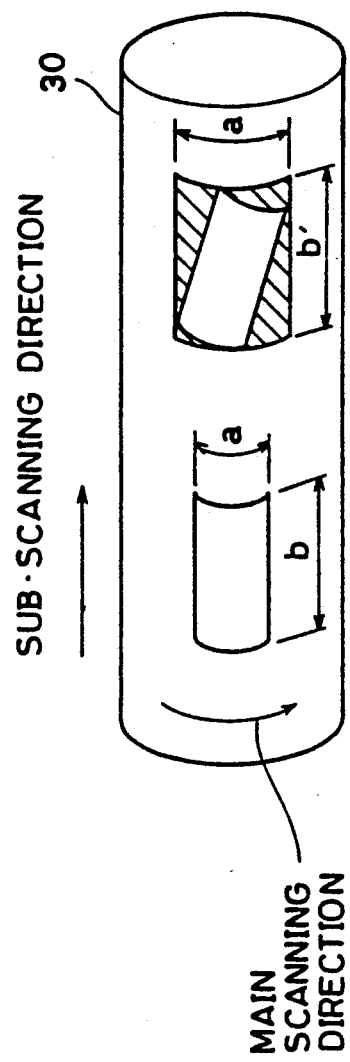
FIG. 6 illustrates scanning of unnecessary regions which occurs when the trimming frame lines are not aligned with the scanning directions of the scanner.

As shown in FIG. 5A, a transparent sheet (33) is laid on the sheet (21) on which dividing lines (22), reference lines (24) the trimming lines (25) and (26), and the outer frame lines (27) are drawn. A desired original is positioned with the outer frame portion of the original (28a) aligned with the outer frame line (27a) which can be recognized through the transparent sheet (33). The original is fixed on the transparent sheet (33) by means of sticky tape, and the reference line (24), the trimming frame lines (25) and (26) corresponding to the original, and the dividing line (22) as needed, are drawn on the transparent sheet (33). When a plurality of originals are to be positioned and mounted on the plurality of outer frame lines shown in one strip, the drawing of the reference lines and the trimming frame lines may be collectively carried out after all the originals are mounted.

The lines may be drawn not on the transparent sheet but on the sticky tapes fixing the originals onto the transparent sheet.

Thereafter, the transparent sheet (33) is moved in parallel (in this embodiment upward) so that the area on which the originals of the second row are to be mounted is aligned with the second strip area (23b) on the sheet (21). In the same manner as described above, the originals of the second row are positioned and mounted on the transparent sheet (33).

For example, in FIG. 5A, each original is mounted on the transparent sheet (33). Three originals could be arranged in each of two rows. The result of such mounting would be the same as that shown in FIG. 7 which is the conventional method. However, compared with the case in which the outer frame lines and the like are directly drawn on the transparent sheet and the originals are mounted, the spaces between the originals can be made smaller and there is less dust. The transparent sheet (33) on which the originals are mounted are wound around the original drum (30) of the color scanner and the reference line or the dividing line drawn on the transparent sheet (33) is aligned with the reference line (31) on the original drum (30) to be fixed. Consequently, the respective originals (28) with the desired trimming frame lines can be attached positioned with the desired angles of inclination. When the reference lines and the trimming frame lines are drawn on the stick tapes, the originals may be peeled off from the transparent sheet to be directly applied on the original drum (30).

Originals corresponding to the trimming frames shown in the third and the following rows of the sheet (21) may be mounted by using another transparent sheet.

Figure 7:
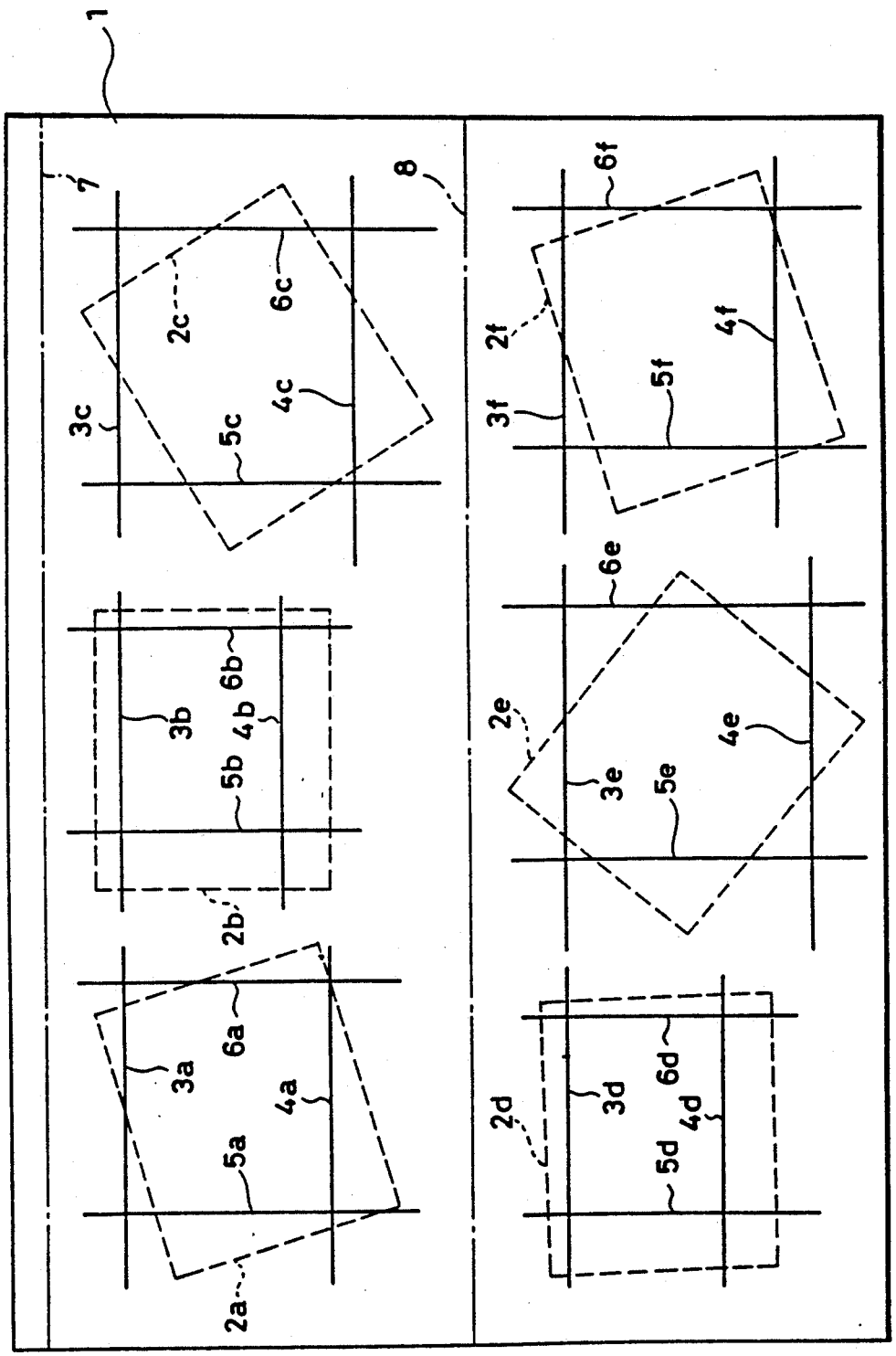
FIG. 7 is a plan view showing a conventional original mounting sheet.

As described above, compared with the conventional sheet (1) shown in FIG. 7, the area necessary for mounting each of the originals is smaller in the original mounting sheet (21) of the present invention. Namely, larger number of originals can be mounted by using a sheet having a prescribed area. Therefore, the sheet can be more effectively used.

Figure 1:
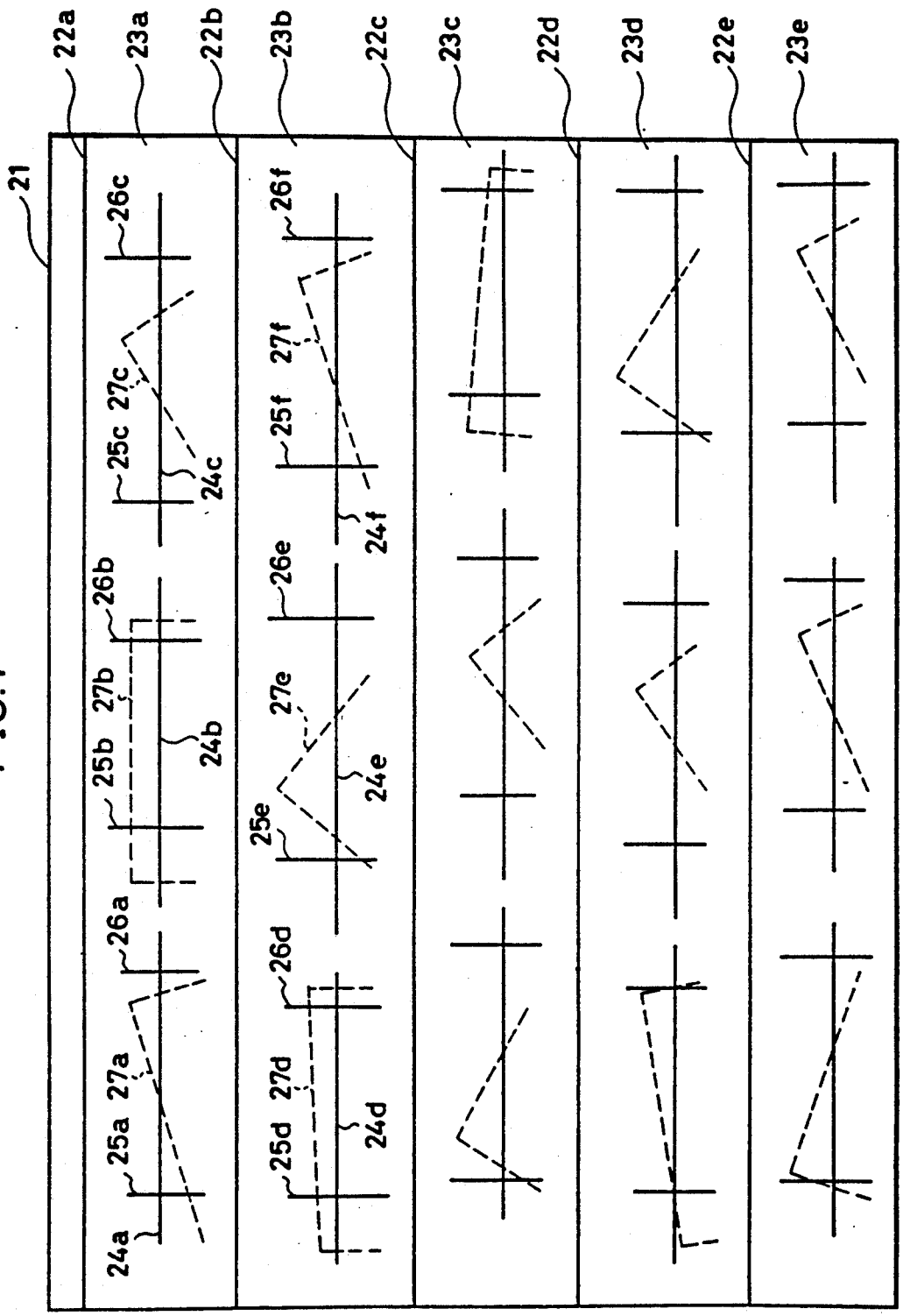
FIG. 1 is a schematic diagram showing an example of the original mounting sheet in accordance with the present invention.

In the above described embodiments, the reference lines (24) shown in the first and second rows of the sheet (21) of the embodiment shown in FIG. 1 correspond to the trimming frame line (3) in the subscanning direction in the prior art shown in FIG. 7. The trimming frame lines (25) and (26) of FIG. 1 correspond to the trimming frame lines (5) and (6) in the main scanning direction of FIG. 7. The outer frame lines (27) of FIG. 1 correspond to the upper portions of the outer frame lines (2) of FIG. 7.

In comparison, when a sheet having approximately the same area is used, 15 originals can be mounted by using the method of the present invention, while only 6 originals can be mounted in accordance with the conventional method. Therefore the, efficiency of using the sheet can be improved by a factor of 2.5. Since the originals are arranged relatively spaced apart from each other in the embodiment shown in FIG. 1 so as to facilitate understanding, the efficiency factor is 2.5. However, in an actual application, the originals may be arranged more closely to each other so as to improve the efficiency to three times or more.

Meanwhile, only the upper end portion of the outer frame of an original included in the strip (23) is shown as the outer frame line (27) on the original mounting sheet in accordance with the present invention. When each of the strips is used cut away from each other, the positioning of the original is done using only the outer frame line in the upper half portion above the reference line (24). Therefore, there is a possibility that the precision in positioning, especially the precision of the angle of inclination will be decreased when only a small portion of the original is projected to the upper portion above the reference line (24).

However, in actual application, the trimming frame is not often inclined by a large angle relative to the outer frame of the original. Namely, in most cases, the trimming frame lines of the originals are set approximately parallel to the outer frame line of the originals. In such cases, for example in the case in FIG. 1, one side of the original is entirely positioned above the reference line (24b) as shown by the outer line (27b) at the center out of three originals shown in the uppermost strip (23a), which permits positioning with high precision. Most of the originals are mounted in this state, and therefore, the above described problem is not often occurs.

When the angle of inclination of the trimming frame to the outer frame of the original is large, only a small area of the original is positioned above the reference line (24) and there is a possibility that precision of the inclination angle will be decreased. Hence, the following method should be used. Namely, a strip which has sufficient width below the reference line (24) is prepared. The outer frame line (27) is drawn extended to the area below the reference line (24), that is, entirely, over the width of the strip, so as to prevent degrading the precision in positioning. It is known through experience that when the width of the strip is extended by 10 mm below the reference line (24), the upper portions of the outer frame lines (of about 80% of the originals) can be completely shown in this range, with the originals being 6×6 cm color films. Consequently, mounting of the originals can be carried out with sufficiently high precision.

Although the original mounting sheet of the present invention is used for mounting originals on a drum type color scanner, the image reproducing apparatus to which the present invention is applied is not limited to the drum type scanner. For example, the present invention can be applied to image reproducing apparatuses in which originals are mounted on a plane such as a planar type scanner, reproducing cameras and so on. The present invention may be applied in the similar manner as described above by providing a positioning reference line at the original mounting portion of such apparatuses so that the reference line (24) of the original mounting sheet can be aligned thereto. As described above, the present invention has the following advantages.

(1) The area of the original mounting sheet required for mounting each original is reduced so that when an original mounting sheet of the same size is used, larger number of originals can be mounted thereon, as compared to conventional method.

(2) Unlike the conventional original mounting sheet, it is not necessary to cut windows to form original mounting portions. Therefore, cumbersome manual operation are eliminated and, together with the above described advantage manufacturing costs are saved.

(3) In the conventional which cuts windows on the original mounting sheet, the originals need to be arranged spaced apart from each other in order to prevent damage to the sheet. On the contrary, in the present invention, the originals can be arranged closer to each other, whereby a larger number of originals can be mounted to the image reproducing apparatus, improving the efficiency of operation of the original reproducing apparatus.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A positioning sheet for an image reproducing apparatus for positioning and reproducing a desired portion of an original, wherein the original has at least two intersecting sides and the image reproducing apparatus specifies said desired portion by a pair of first reference lines which extend in a first direction and a pair of second reference lines which extend in a second direction intersecting the first direction, said positioning sheet comprising:
    only one first reference line corresponding to one of said pair of first reference lines associated with said image reproducing apparatus;
    a pair of second reference lines corresponding to said pair of second reference lines associated with said image reproducing apparatus and
    a third reference line intersecting with said only one first reference line and specifying at least two intersecting lines of said original.

2. A positioning sheet according to claim 1, wherein said first, second and third reference lines constitute a single reference line unit, and
    said positioning sheet comprises a plurality of said reference line units formed in said first direction.

3. A positioning sheet according to claim 2, further comprising a plurality of said reference line units formed in said second direction.

4. A positioning sheet according to claim 3, wherein said positioning sheet is formed by a projection type digitizer and an X-Y plotter.

5. A positioning sheet for an image reproducing apparatus for positioning an original and for forming a reproduced image of the original by scanning the original in a first direction and in a second direction intersecting said first direction, said original having at least two intersecting sides, said positioning sheet comprising:
    only a single reference line indicative of said first direction;
    two second reference lines indicative of a prescribed range in said second direction; and
    a third reference line intersecting said single reference line and specifying at least two intersecting sides of said original.

6. A method of positioning an original by using a positioning sheet in an image reproducing apparatus for reproducing the original, the positioning sheet including a first reference line extending in a first direction and a pair of second reference lines intersecting said first reference line for specifying a desired area of the original and third reference lines intersecting said first reference line and specifying at least two intersecting sides of said original, said positioning sheet being divided into a first portion in which at least one intersecting point of said third reference lines is located and a second portion in which said intersecting point of said third reference lines does not exist, said method comprising the steps of:
    removing said second portion;
    removing the area defined by said third reference line in said first portion and;

positioning said original along said third reference line in said first portion of said positioning sheet.

7. The method according to claim 6, wherein
said first, second and third reference lines constitute a reference line unit,
said positioning sheet comprises a plurality of said reference line units formed in said first direction;
said method further comprising the steps of:
removing said second portion for said plurality of reference line units;
removing the area defined by said third reference line in said first portion in said plurality of reference line units; and
positioning a plurality of originals at said first portion of said positioning sheet along said third reference line for said plurality of reference line units.

8. The method according to claim 7, wherein
said positioning sheet comprises a plurality of said reference line units formed spaced apart from each other in said second direction.

9. A method of positioning an original by using a transparent positioning sheet in an image reproducing apparatus for reproducing the original, said positioning sheet including a first reference line extending in a first direction and a pair of second reference lines intersecting said first reference line for specifying a desired area of the original, and third reference lines intersecting said first reference line for specifying at least two intersecting sides of said original, said positioning sheet being divided into a first portion in which at least one intersecting point of said third reference lines is located and a second portion in which said intersecting point of said third reference lines does not exist, said method comprising the steps of:
removing said second portion; and
positioning said original along the third reference line in said first portion of said positioning sheet.

10. The method according to claim 9, wherein
said first, second and third reference lines constitute a reference line unit,
said positioning sheet comprises a plurality of said reference line units formed in said first direction,
said method comprising the further steps of:
removing said second portion from the plurality of reference line units; and
positioning a plurality of said originals along said third reference lines in said first portions of said positioning sheet for said plurality of reference line units.

11. The method according to claim 10, wherein said positioning sheet comprises a plurality of said reference line units formed spaced apart from each other in said second direction.

12. The method according to claim 9, wherein
said transparent sheet has a front surface and a rear surface, said rear surface being adherable and
said step of positioning said original in said first portion of said positioning sheet along said third reference line comprises positioning said original by adhering said original to said sheet by using the adherable rear surface of said transparent sheet.

13. A method of positioning an original by using a positioning sheet and an image reproducing apparatus for reproducing said original, said sheet having a plurality of reference line units aligned in a first direction, each said unit including a first reference line extending in a second direction and a pair of second reference lines formed in the first direction which intersects said first reference line for specifying a desired area of the original and a third reference line intersecting said first reference and specifying at least two sides intersecting with each other of said original, said method comprising the steps of:
selecting at least one set of reference line units out of the plurality of reference line units formed in said first direction and laying a transparent sheet to cover the same;
fixing a first original along the third reference line of said selected reference line unit of said transparent sheet;
moving said transparent sheet in said first direction so that the third reference line of an adjacent reference line unit in said first direction does not intersect said first original and said selected reference line unit; and
fixing a second original along the third reference line of said adjacent reference line unit at the position to which said transparent sheet is moved.

14. The method according to claim 13, further comprising the step of drawing at least said pair of second reference lines in said first direction on and through said transparent sheet after carrying out the step of adhering said first original.

15. The method according to claim 13, wherein
said step of positioning said original in said first portion of said positioning sheet along said third line comprises the step of fixing said original on said transparent sheet by using a sticky tape.

16. The method according to claim 13, wherein
a plurality of said reference line units are formed continuously in said second direction, and
each of said steps is carried out for the plurality of units formed continuously in said second direction.

* * * * *